(12) United States Patent
Oguri et al.

(10) Patent No.: US 10,517,170 B2
(45) Date of Patent: Dec. 24, 2019

(54) MULTILAYER SUBSTRATE

(71) Applicant: Murata Manufacturing Co., Ltd., Nagaokakyo-shi, Kyoto-fu (JP)

(72) Inventors: Shinya Oguri, Nagaokakyo (JP); Yuki Ito, Nagaokakyo (JP); Yuya Dokai, Nagaokakyo (JP); Isamu Morita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/149,162

(22) Filed: Oct. 2, 2018

(65) Prior Publication Data

US 2019/0037685 A1 Jan. 31, 2019

Related U.S. Application Data

(63) Continuation of application No. PCT/JP2017/043987, filed on Dec. 7, 2017.

(30) Foreign Application Priority Data

Jan. 5, 2017 (JP) .................................. 2017-000638

(51) Int. Cl.
*H05K 1/02* (2006.01)
*H05K 3/46* (2006.01)
(Continued)

(52) U.S. Cl.
CPC ........... *H05K 1/0271* (2013.01); *H05K 1/028* (2013.01); *H05K 3/4652* (2013.01); *H05K 1/111* (2013.01);
(Continued)

(58) Field of Classification Search
CPC .............................. H05K 1/0278; H05K 1/028
See application file for complete search history.

(56) References Cited

U.S. PATENT DOCUMENTS 8,493,747 B2 * 7/2013 Naganuma ........... H05K 3/4691
174/254
2009/0107703 A1 4/2009 Abe et al.
2014/0184359 A1 7/2014 Iida et al.

FOREIGN PATENT DOCUMENTS

JP 60-140782 A 7/1985
JP 2009-302343 A 12/2009
(Continued)

OTHER PUBLICATIONS

Official Communication issued in International Patent Application No. PCT/JP2017/043987, dated Feb. 20, 2018.

*Primary Examiner* — Jeremy C Norris
(74) *Attorney, Agent, or Firm* — Keating & Bennett, LLP

(57) ABSTRACT

A multilayer board includes a flexible base material including laminated insulator layers and curved along an X-axis direction on a plane orthogonal or substantially orthogonal to a lamination direction, an interlayer connection conductor on the flexible base material, and a notch pair on the flexible base material at positions symmetrical or substantially symmetrical in the X-axis direction with respect to a position of the interlayer connection conductor, the notch pair extending in a Y-axis direction orthogonal or substantially orthogonal to the X-axis direction on the plane. The interlayer connection conductor is within a region defined by the notch pair and lines respectively joining ends of the notch pair in the Y-axis direction. A radius of curvature of a region of the flexible base material between the notch pair in the X-axis direction being greater than curvature radii of regions outside of the notch pair.

15 Claims, 9 Drawing Sheets

(51) Int. Cl.
  *H05K 1/11* (2006.01)
  *H05K 3/40* (2006.01)
  *H05K 3/00* (2006.01)

(52) U.S. Cl.
  CPC ......... *H05K 3/0023* (2013.01); *H05K 3/0032* (2013.01); *H05K 3/4069* (2013.01); *H05K 2201/0939* (2013.01); *H05K 2201/09063* (2013.01); *H05K 2203/068* (2013.01); *H05K 2203/107* (2013.01)

(56) References Cited

FOREIGN PATENT DOCUMENTS

WO  2007/119608 A1  10/2007
WO  2013/114975 A1  8/2013

\* cited by examiner (a)Step 1

(b)Step 2

(c)Step 3

(d)Step 4

MULTILAYER SUBSTRATE

CROSS REFERENCE TO RELATED APPLICATIONS

This application claims the benefit of priority to Japanese Patent Application No. 2017-000638 filed on Jan. 5, 2017 and is a Continuation Application of PCT Application No. PCT/JP2017/043987 filed on Dec. 7, 2017. The entire contents of each application are hereby incorporated herein by reference.

BACKGROUND OF THE INVENTION

1. Field of the Invention

The present invention relates to a multilayer board that includes a plurality of insulator layers laminated together.

2. Description of the Related Art

Some multilayer boards each including a plurality of laminated insulator layers are flexible and bendable. At this time, if an interlayer connection conductor is provided in the multilayer board, the interlayer connection conductor does not have flexibility, and thus peeling, etc. may occur at and around the interlayer connection conductor.

In order to cope with this, there has been proposed a multilayer board including an interlayer connection conductor with via conductors staggered across a plurality of layers along the bending direction (see, e.g. International Publication No. 2013/114975).

As compared to the case of having an interlayer connection conductor with via conductors vertically aligned and joined together across a plurality of layers, the multilayer board disclosed in International Publication No. 2013/114975 is able to relieve the concentration of bending stresses. However, the staggered arrangement of the via conductors along the bending direction requires a corresponding length dimension. This may make it difficult to utilize this structure in a small-sized multilayer board.

SUMMARY OF THE INVENTION

Preferred embodiments of the present invention provide multilayer boards each having high connection reliability in an interlayer connection conductor, and capable of reducing, with space savings, bending stresses acting on the interlayer connection conductor when subjected to a bending force.

A multilayer board according to a preferred embodiment of the present invention includes a flexible base material including a plurality of laminated insulator layers and curved along a first direction on a plane orthogonal or substantially orthogonal to a lamination direction; an interlayer connection conductor disposed on the flexible base material; and a notch pair disposed on the flexible base material at positions symmetrical in the first direction with respect to a position of the interlayer connection conductor, the notch pair extending in a second direction orthogonal or substantially orthogonal to the first direction on the plane; in plan view from the lamination direction, the interlayer connection conductor lying within a region defined by notches of the notch pair and by lines respectively joining respective ends of the notches in the second direction, in the flexible base material, a curvature radius of a region between the notch pair in the first direction being greater than curvature radii of regions outside of the notch pair.

According to preferred embodiments of the present invention, multilayer boards are provided that each have high connection reliability in an interlayer connection conductor, and are capable of reducing, with space savings, bending stresses applied to the interlayer connection conductor when subjected to a bending force.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
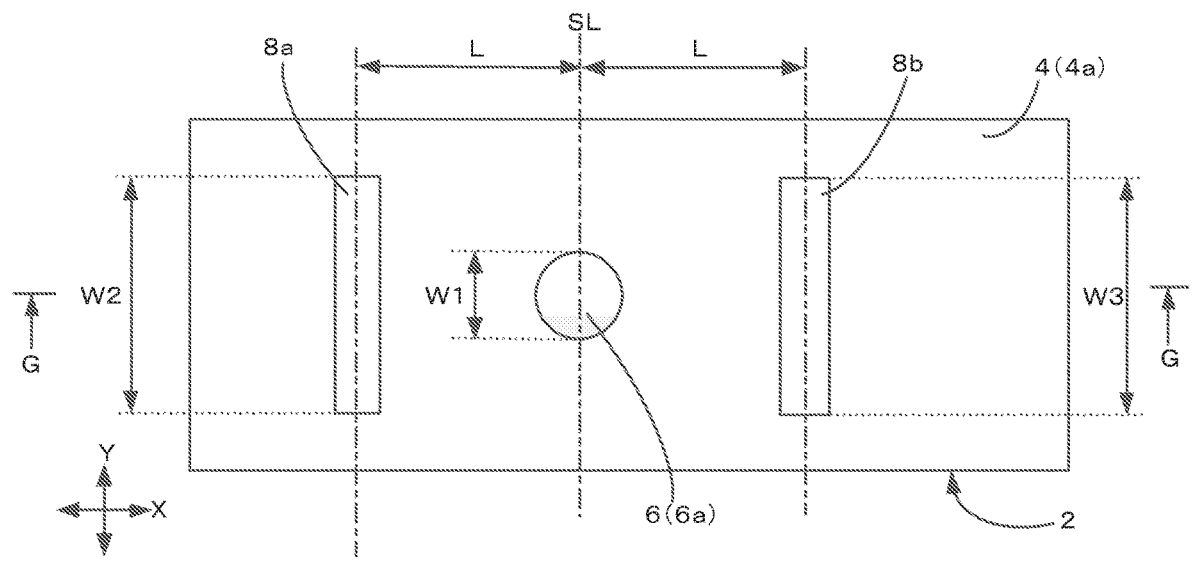
FIGS. 1A to 1C schematically show, in plan view and in cross section, a multilayer board according to a first preferred embodiment of the present invention.

Various preferred embodiments of the present invention will hereinafter be described with reference to the drawings. In the drawings, the same reference numerals are used for corresponding members having the same or substantially the same structure and functions. Although the preferred embodiments are shown separately as a matter of convenience for description of essential points or for ease of understanding, configurations shown as different preferred embodiments may be partially replaced or combined. In second and subsequent preferred embodiments, description of common matters to a first preferred embodiment will be omitted and only different points will be described. In particular, similar operational effects and advantages based on similar configurations will not individually be referred to for each of the preferred embodiments.

First Preferred Embodiment

Figure 1B:
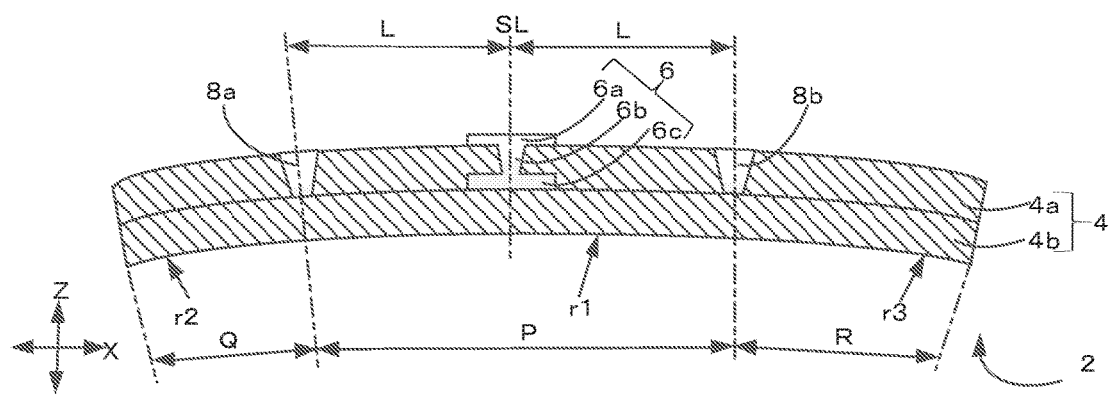
Figure 1C:
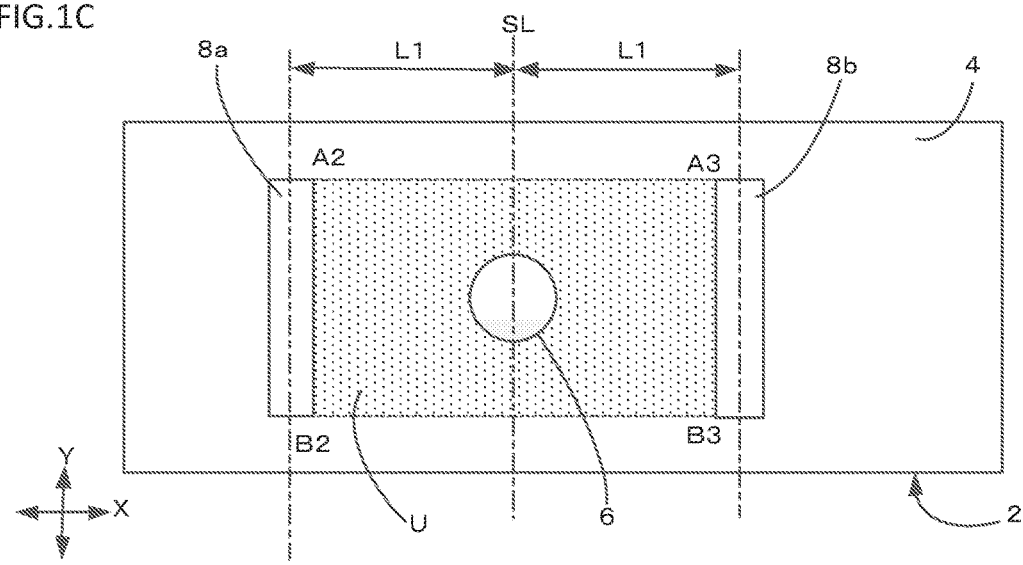

FIGS. 1A to 1C schematically show, in plan view and in cross section, a multilayer board 2 according to a first preferred embodiment of the present invention. FIG. 1A is a plan view, FIG. 1B is a cross sectional view taken along line G-G of FIG. 1A, and FIG. 1C is a reference plan view showing a positional relationship between an interlayer connection conductor and notches.

The multilayer board 2 according to the present preferred embodiment includes a flexible base material 4 including a plurality of laminated insulator layers 4a and 4b. In all of the views, with a Z-axis direction being a lamination direction, the flexible base material 4 is curved along an X-axis (referred to as "first direction") that is one direction on a plane orthogonal or substantially orthogonal to the Z-axis direction (lamination direction). That is, the X-axis direction (first direction) is a bending direction of the flexible base material 4. Let a Y-axis direction (referred to as "second direction") be a direction orthogonal or substantially orthogonal to the X-axis direction (first direction) on the plane orthogonal or substantially orthogonal to the Z-axis direction (lamination direction), the Y-axis direction (second direction) is a bending axis direction of the flexible base material. To describe "being curved along the X-axis direction (first direction)" in more detail, it is meant that, when viewed laterally from the Y-axis direction (second direction), the flexible base material 4 has a smooth curvilinear shape extending in the X-axis direction (first direction) and convex toward the Z-axis direction (lamination direction) (see FIG. 1B).

The flexible base material 4 includes an interlayer connection conductor 6. In FIGS. 1A to 1C, the interlayer connection conductor 6 is disposed slightly left of a center of the flexible base material 4 in the X-axis direction (first direction). Note that this is not limiting and any disposition may be used including the case in which the interlayer connection conductor 6 is disposed at the center or approximate center of the flexible base material 4 in the X-axis direction (first direction).

The interlayer connection conductor 6 includes an electrode 6a provided on an upper surface of an insulator layer 4a, an electrode 6c provided on a lower surface thereof, and a via conductor 6b extending through the insulator layer 4a in the thickness direction to electrically join the electrodes 6a and 6c. In plan view, the outer dimensions of the electrodes 6a and 6c are greater than the outer dimension of the via conductor 6b, and the length of the interlayer connection conductor 6 in the Y-axis direction (second direction) is W1.

Although in FIGS. 1A to 1C the electrodes 6a and 6c preferably have a circular or substantially circular planar shape, for example, they may have any other planar shape including a square and a rectangle without being limited thereto.

The flexible base material 4 includes two notches 8a and 8b extending in the Y-axis direction (second direction) at symmetrical or substantially symmetrical positions in the X-axis direction (first direction) of the flexile base material 4 with respect to the position of the interlayer connection conductor 6. The notches 8a and 8b may be defined by an opening disposed on the flexible base material 4 or may be defined by a recess disposed on the flexible base material 4. In either case, the length (width dimension) of the notches 8a and 8b in the Y-axis direction is preferably smaller than the full length of the flexible base material 4. As a result, the notches 8a and 8b that disperse the bending stress as described later are able to be provided in a space saving manner.

The phrase "symmetrical or substantially symmetrical positions with respect to the position of the interlayer connection conductor 6", in the case of the via conductor 6b passing through only one insulator layer, indicates that, when a line SL of symmetry is a line extending through the center of the via conductor 6b in the Y-axis direction (second direction) in plan view, a distance L between the line SL of symmetry and the notch 8a (in more detail, the center of the notch 8a) is equal or substantially equal to a distance L between the line SL of symmetry and the notch 8b (in more detail, the center of the notch 8b).

In addition, also in the case (including the case shown in FIGS. 8A and 8B) of including the interlayer connection conductor 6 with the via conductors 6b vertically aligned across a plurality of insulator layers without being staggered in the X-axis direction in lateral view from the Y-axis direction (second direction), the line SL of symmetry may be defined in the same manner as described above.

The two notches 8a and 8b are openings extending entirely through the insulator layer 4a in the Z-axis direction (lamination direction). The length of the notch 8a in the Y-axis direction (second direction) is W2. The length of the notch 8b in the Y-axis direction (second direction) is W3. In the present preferred embodiment, neither of the two notches 8a and 8b extend to ends of the flexible base material 4 in the Y-axis direction (second direction). From the viewpoint of proper relief of the bending stress, it is preferable that the values of the lengths W2 and W3 are not significantly different from one another. Hereinafter, the two symmetrically or substantially symmetrically arranged notches 8a and 8b will be referred to together as a notch pair 8ab.

The length W1 of the interlayer connection conductor 6 in the Y-axis direction (second direction) is preferably smaller than the length W2 of the notch 8a and the length W3 of the notch 8b.

In plan view from the Z-axis direction (lamination direction), as shown in FIG. 1C, the interlayer connection conductor 6 is located within a region U (see a dotted area) surrounded by the notches 8a and 8b of the notch pair 8ab and lines joining ends A2 and B2 of the notch 8a in the Y-axis direction (second direction) and ends A3 and B3 of the notch 8b in the Y-axis direction (second direction), respectively.

As shown in FIG. 1B, the flexible base material 4 is curved along the X-axis direction (first direction). To describe in more detail, a radius of curvature r1 of a region P between the notch pair 8ab in the X-axis direction (first direction) is greater than a radius of curvature r2 of a region Q and a radius of curvature radius r3 of a region R, outside of the notch pair 8ab.

The notches 8a and 8b of the notch pair 8ab may be positioned closer to the interlayer connection conductor 6 than to the ends of the flexible base material 4 in the X-axis direction (first direction) so that the regions Q and R having a higher degree of freedom of the radius of curvature are able to be increased in size. Thus, in this case, the degree of freedom in bending shapes of the multilayer board 2 is improved.

As described herein, the multilayer board 2 according to the first preferred embodiment of the present invention includes the plurality of insulator layers 4a and 4b laminated together and defining the flexible base material 4 that is curved along the X-axis direction (first direction), the interlayer connection conductor 6 disposed in the flexible base material 4, and the notch pair 8ab positioned symmetrically or substantially symmetrically in the X-axis direction (first direction) of the flexible base material 4 with respect to the position of the interlayer connection conductor 6 and extending in the Y-axis direction (second direction) thereof, wherein in plan view from the Z-direction (lamination direction), the interlayer connection conductor 6 is positioned within the region U surrounded by the notches 8a and 8b of the notch pair 8ab and lines (A2-A3 and B2-B3) joining the respective ends of the respective notches 8a and 8b in the Y-axis direction (second direction), and in the flexible base material 4, the radius of curvature r1 in the X-axis direction (first direction) of the region P between the notch pair 8ab is greater than the radii of curvature r2 and r3 of the regions Q and R outside the notch pair 8ab.

With the above-described configuration, the following advantageous effects are obtained, for example.

Since the notch pair 8ab is disposed on the flexible base material 4 at symmetrical or substantially symmetrical positions in the X-axis direction (first direction) with respect to the position of the interlayer connection conductor 6, the bending stress concentrated in the interlayer connection conductor 6 and its peripheral region is able to be dispersed when a bending force is applied to the flexible base material 4, thus enabling relief of the bending stress acting on the interlayer connection conductor 6 and its peripheral region.

Since the length of the notch pair 8ab in the X-axis direction (first direction) is relatively small, relief of the bending stress when a bending force is applied to the flexible base material 4 is able to be achieved with space savings.

Since in plan view, the interlayer connection conductor 6 is disposed within the region U surrounded by the notches 8a and 8b and lines (A2-A3 and B2-B3) joining the respective ends in the Y-axis direction (second direction), relief of the bending stress in the entire interlayer connection conductor 6 and peripheral region thereof is securely achieved.

Furthermore, since the flexible base material 4 is curved along the X-axis direction (first direction) in advance, the bending force applied to the flexible base material 4 during the bending processing is able to be reduced in advance.

In particular, since the radius of curvature r1 of the region P between the notch pair 8ab is greater than the radii of curvature r2 and r3 of the regions Q and R outside the notch pair 8ab, a shape along a member to be attached is able to be provided to the multilayer board 2 so that the bending force applied to the flexible base material 4 during the bending processing is able to be further reduced.

As described herein, in the present preferred embodiment, it is possible to provide the multilayer board 2 having high connection reliability in the interlayer connection conductor 6, and capable of reducing, with space savings, bending stresses applied to the interlayer connection conductor when subjected to a bending force.

Figure 2A:
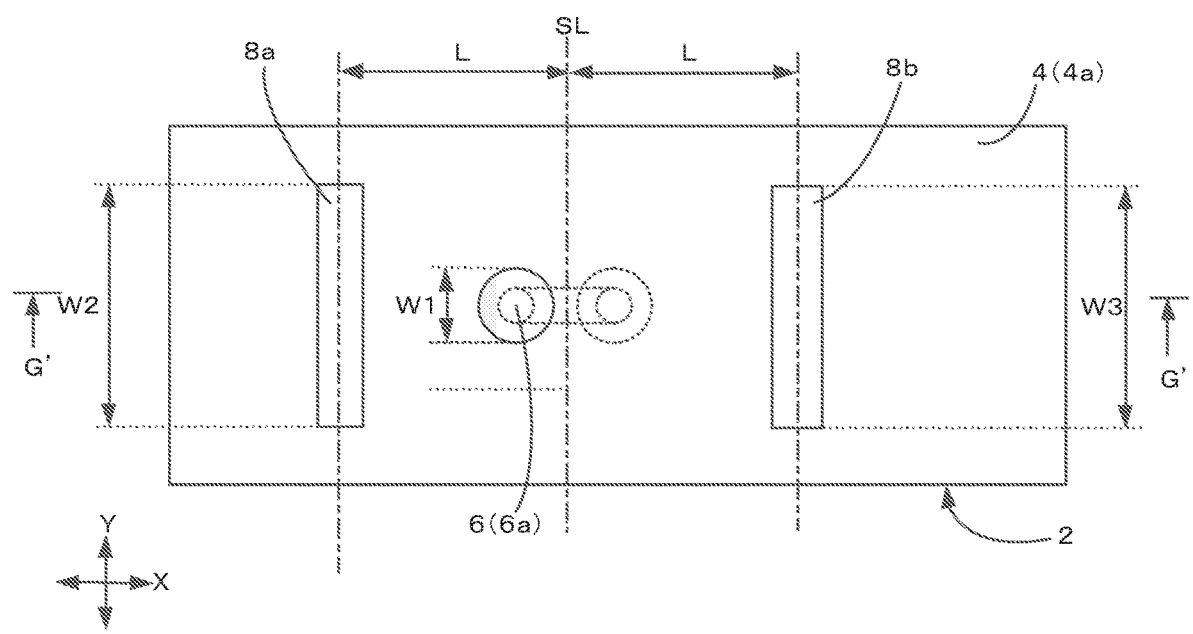
FIGS. 2A and 2B schematically show, in plan view and in cross section, a multilayer board according to a modification of the first preferred embodiment of the present invention.
Figure 2B:
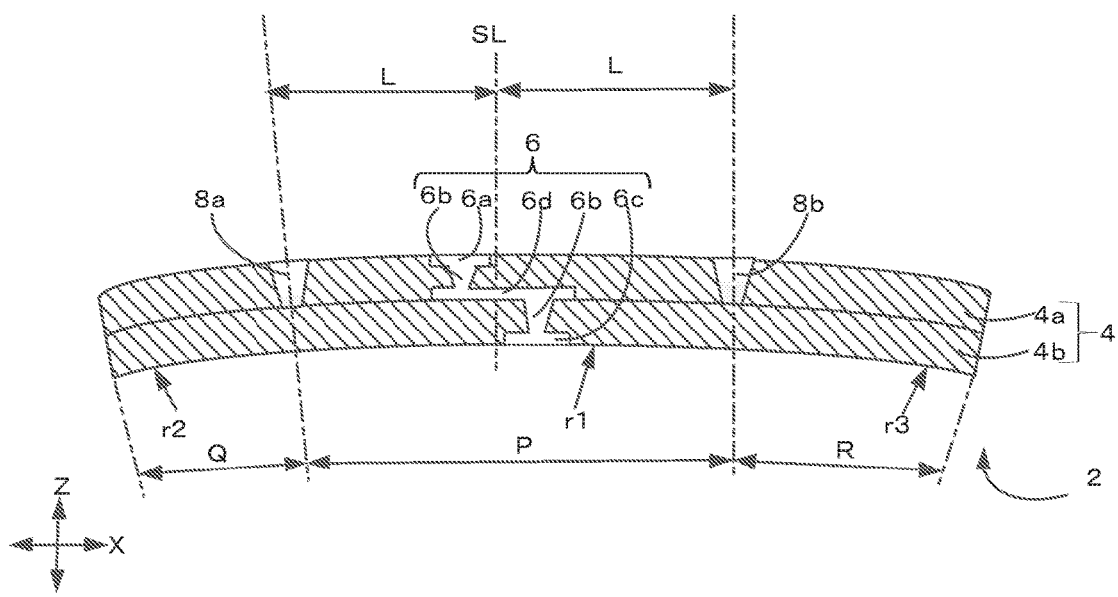

The interlayer connection conductor 6 according to the present preferred embodiment may have a different configuration from that of FIGS. 1A to 1C. FIGS. 2A and 2B schematically show a plan view and a sectional view of the multilayer board according to a modification of the first preferred embodiment of the present invention. FIGS. 2A and 2B show the case in which an interlayer connection conductor 6 is provided that includes via conductors 6 that are staggered along the X-axis direction (first direction) across a plurality of layers. This preferred embodiment is applicable also to the multilayer board including such an interlayer connection conductor 6.

In this case, to describe "symmetrical positions with respect to the position of the interlayer connection conductor 6", the line SL of symmetry is preferably a line extending in the Y-axis direction (second direction) through the center of the interlayer connection conductor 6 extending along the X-axis direction (first direction) in lateral view from the Y-axis direction (second direction).

Although such an interlayer connection conductor 6 requires an increased amount of space in the X-axis direction (first direction) of the flexible base material 4, if such an arrangement is feasible, an effect of relieving the stress concentration by the interlayer connection conductor 6 itself, in addition to the above advantageous effects, is able to be obtained.

Figure 3:
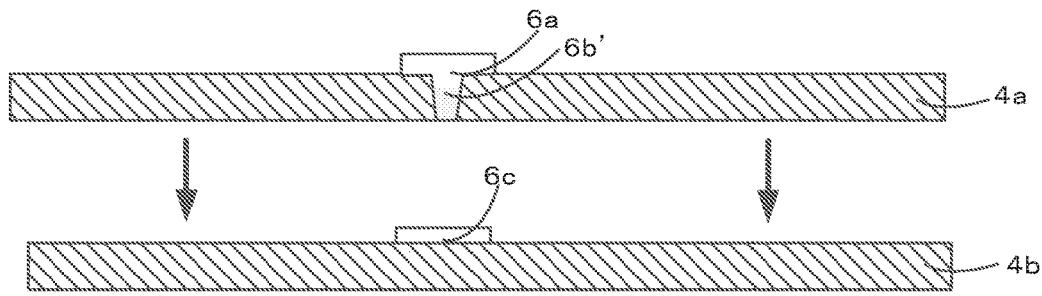
FIG. 3 is a schematic view showing an example of a manufacturing method of the multilayer board shown in FIGS. 1A to 1C.
Figure 3:
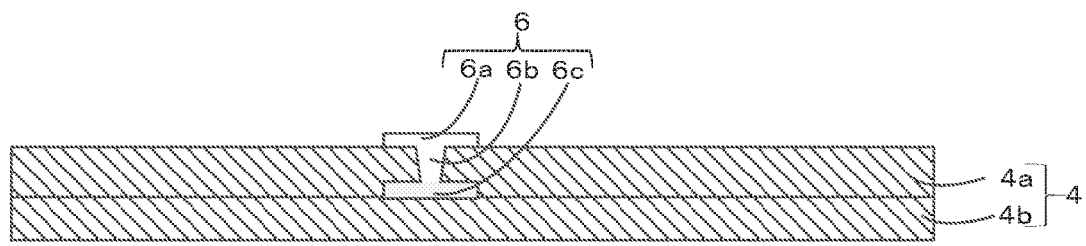
Figure 3:
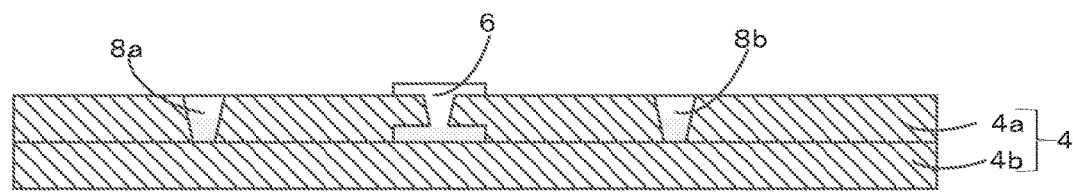
Figure 3:
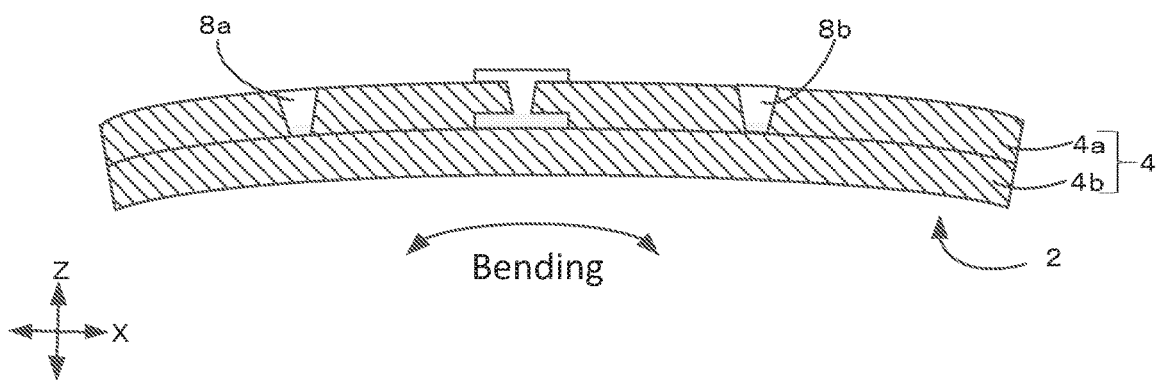

Referring next to FIG. 3, a non-limiting example of a manufacturing method of the multilayer board 2 according to the first preferred embodiment of the present invention will be described. FIG. 3 is a schematic view showing an example of the manufacturing method of the multilayer board shown in FIGS. 1A to 1C.

Step 1

Two insulating films each including a copper foil laminated on the entire or substantially the entire surface of one side thereof are first prepared. A thermoplastic resin, such as liquid crystal polymer (LCP), for example, may preferably be used as the insulating film. Next, by a patterning process, such as photolithography, for example, the insulator layer 4a, on which a pattern including the electrode 6a is formed, and the insulator layer 4b, on which a pattern including the electrode 6c is formed, are formed.

Next, by laser machining, for example, from the side not laminated with the copper foil, a via hole extending through only the insulating base material is formed in the insulator layer 4a and then is filled with an electrically conductive paste 6b'.

Step 2

Next, by pressure pressing, for example, the insulator layers 4a and 4b are joined together to form the flexible base material 4. Due to the use of the thermoplastic resin, the insulator layers 4a and 4b are firmly adhered together and integrated so that interlayer peeling when subjected to a bending force is able to be more effectively reduced or prevented. Particularly, by virtue of the direct lamination of the plurality of insulator layers 4a and 4b without intervention of a different type of resin layer, such as an adhesive layer, an interface is not provided between the different insulator layers, with the result that interlayer peeling is more effectively reduced or prevented.

In step 2, the electrically conductive paste 6b' filled in the through-hole is also heated and hardened, resulting in the via conductor 6b. At this time, it is joined and integrated with the upper electrode 6a (copper foil) and the lower electrode 6c (copper foil) to form the interlayer connection conductor 6.

Step 3

The notches 8a and 8b are then formed by laser machining, for example, at positions symmetrical or substantially symmetrical with respect to the interlayer connection conductor 6. In the case of the laser machining, fundamentally, the shape becomes wider at the front side but slightly narrower at the far side.

Step 4

The flexible base material 4 including the interlayer connection conductor 6 and the notches 8a and 8b is heated to bend the flexible base material 4. Depending on the radius of curvature of a press die used at this time, the flexible base material 4 is able to have a different radius of curvature for each of the regions. In the manner described above, the multilayer board 2 as shown in FIGS. 1A to 1C is able to be manufactured.

Non-limiting examples of dimensions of the manufactured multilayer board 2 may preferably include the case in which the thickness of the insulator layers 4a and 4b is about 30 μm to about 80 μm; the outer diameter of the electrode 6a of the interlayer connection conductor 6 is about 200 µm to about 400 µm; the outer dimension of the via conductor 6b is about 120 µm to about 240 µm; and the width dimension (dimension in the X-axis direction) of the notches 8a and 8b is about 30 µm to about 80 µm.

Second Preferred Embodiment

Figure 4A:
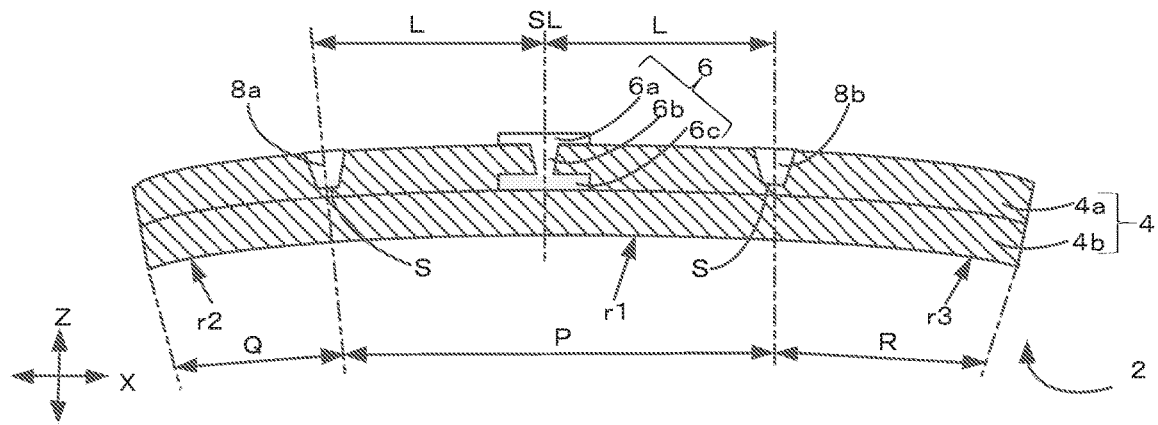
FIGS. 4A to 4C schematically show, in cross section and in plan view, a multilayer board according to a second preferred embodiment of the present invention.
Figure 4B:
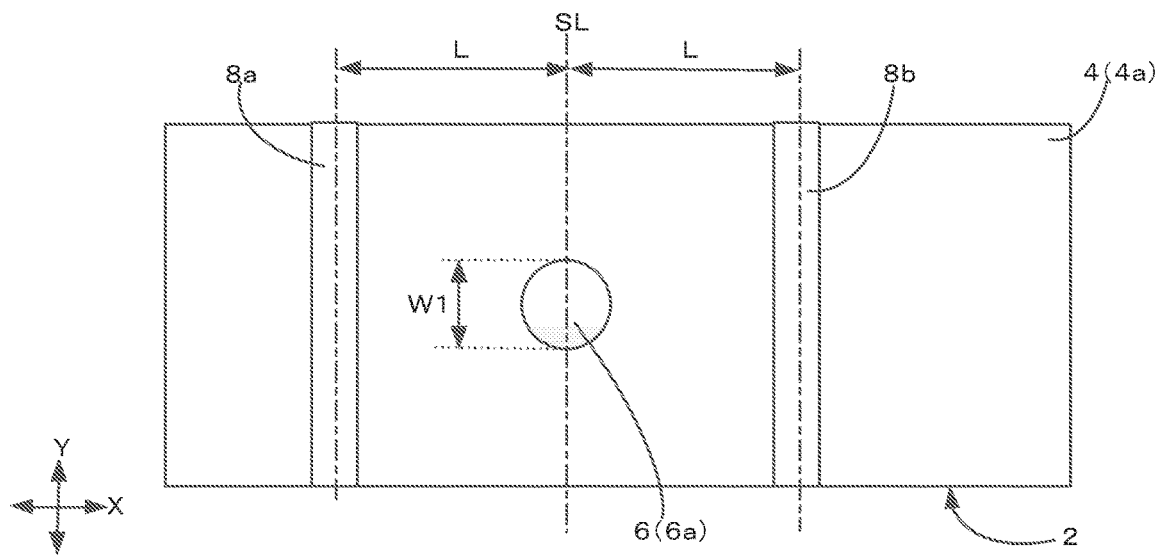
Figure 4C:
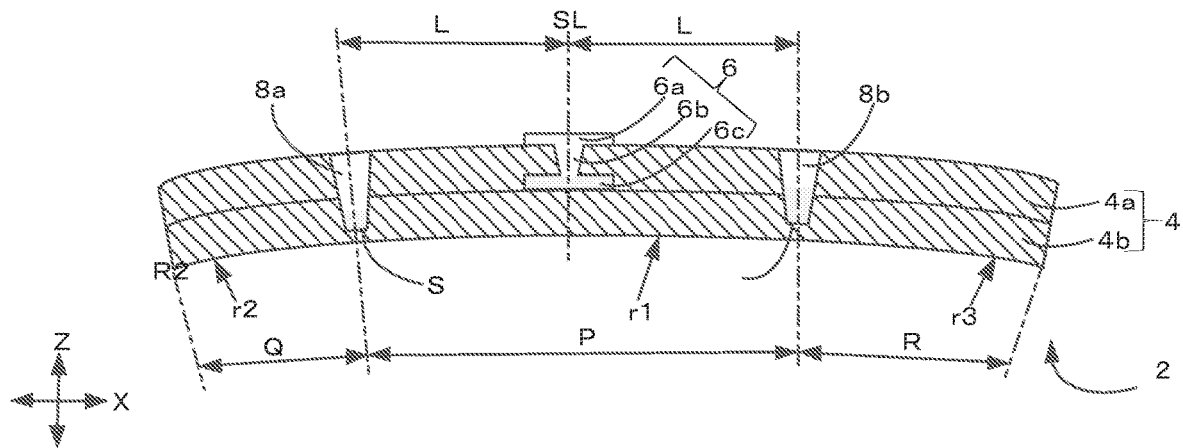

FIGS. 4A to 4C schematically show in cross section and in plan view a multilayer board 2 according to a second preferred embodiment of the present invention.

In the present preferred embodiment, bottom surfaces S of the notches 8a and 8b in the Z-axis direction (lamination direction) are not coincident with a layer interface between the insulators 4a and 4b. Stress tends to concentrate on the layer interface between the insulator layers 4a and 4b, which layers become likely to peel off at the interface when subjected to a bending force. However, by not allowing the bottom surfaces S of the notches 8a and 8b to coincide with the layer interface between the insulator layers 4a and 4b as in the present preferred embodiment, peeling-off arising from the notches 8a and 8b is less likely to occur when subjected to the bending force.

The sectional view of FIG. 4A shows the case in which the bottom surfaces S of the notches 8a and 8b do not extend to the bottom of the upper insulator layer 4a. Specifically, a portion of the insulator layer 4a remains between the notch bottoms and the layer interface so that the notches 8a and 8b do not extend across the layer interface. Such an arrangement of the notches 8a and 8b enables peeling-off at the layer interface arising from the notches 8a and 8b to be effectively reduced or prevented when subjected to a bending force.

Since in the case of FIG. 4A the insulator layer 4a remains between the notch bottoms and the layer interface, the notches 8a and 8b may preferably extend to the ends of the flexible base material 4 in the Y-axis direction (second direction), for example, as shown in the plan view of FIG. 4B.

In the sectional view of FIG. 4C, the bottom surfaces of the notches 8a and 8b extend beyond the insulator layer 4a but not to the bottom of the insulator layer 4b. Also, when structuring the notches 8a and 8b in this manner, the bottom surfaces of the notches 8a and 8b do not coincide with the layer interface, thus making it possible to reduce or prevent peeling-off at the layer interface arising from the notches 8a and 8b when subjected to a bending force.

As described above, in the multilayer board 2 according to the second preferred embodiment of the present invention, the bottom surfaces S in the X-axis direction (lamination direction) of the notches 8a and 8b defining the notch pair 8ab are not coincident with the layer interface between the insulator layers 4 and 4b, such that peeling-off arising from the notches 8a and 8b is less likely to occur when subjected to the bending force, which results in a further improved connection reliability of the interlayer connection conductor 6.

Third Preferred Embodiment

Figure 5:
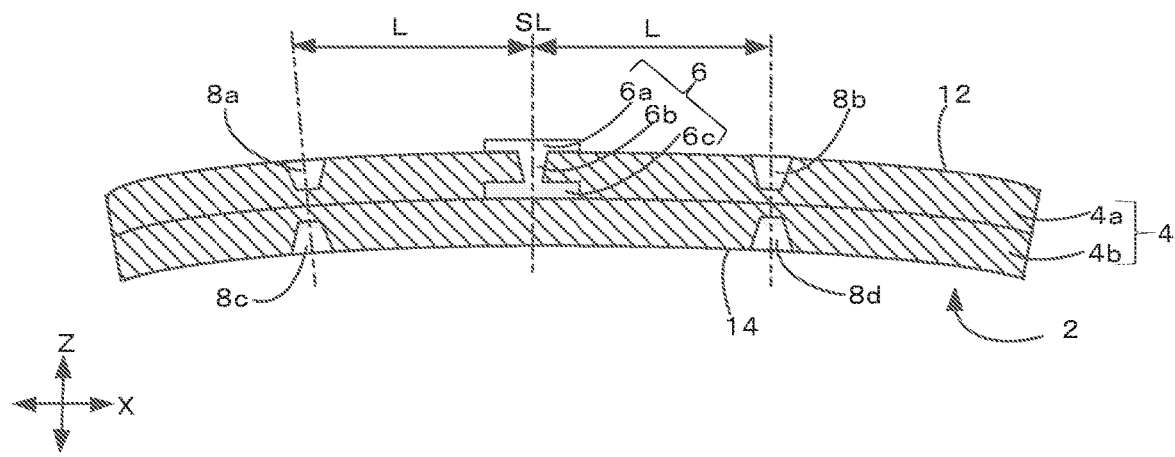
FIG. 5 is a cross sectional view schematically showing a multilayer board according to a third preferred embodiment of the present invention.

FIG. 5 is a sectional view schematically showing a multilayer board according to a third preferred embodiment of the present invention.

In the present preferred embodiment, a notch pair 8ab (notches 8a and 8b) and a notch pair 8cd (notches 8c and 8d) are disposed on a first main surface 12 side and a second main surface 14 side, respectively, of the flexible base material 4.

By disposing the notch pairs 8ab and 8cd on the upper and lower surface sides, respectively, of the flexible base material 4 in this manner, it is possible to effectively disperse bending stress concentrating in the interlayer connection conductor 6 and its peripheral region when a bending force is applied to the flexible base material 4.

Although in FIG. 5 the case is shown in which the flexible base material 4 includes the two insulator layers 4a and 4b, similar effects to the above are able to be obtained by disposing the notch pairs on the first main surface side and the second main surface side at the upper and lower ends, respectively, even if the flexible base material 4 includes three or more insulator layers.

Fourth Preferred Embodiment

Figure 6:
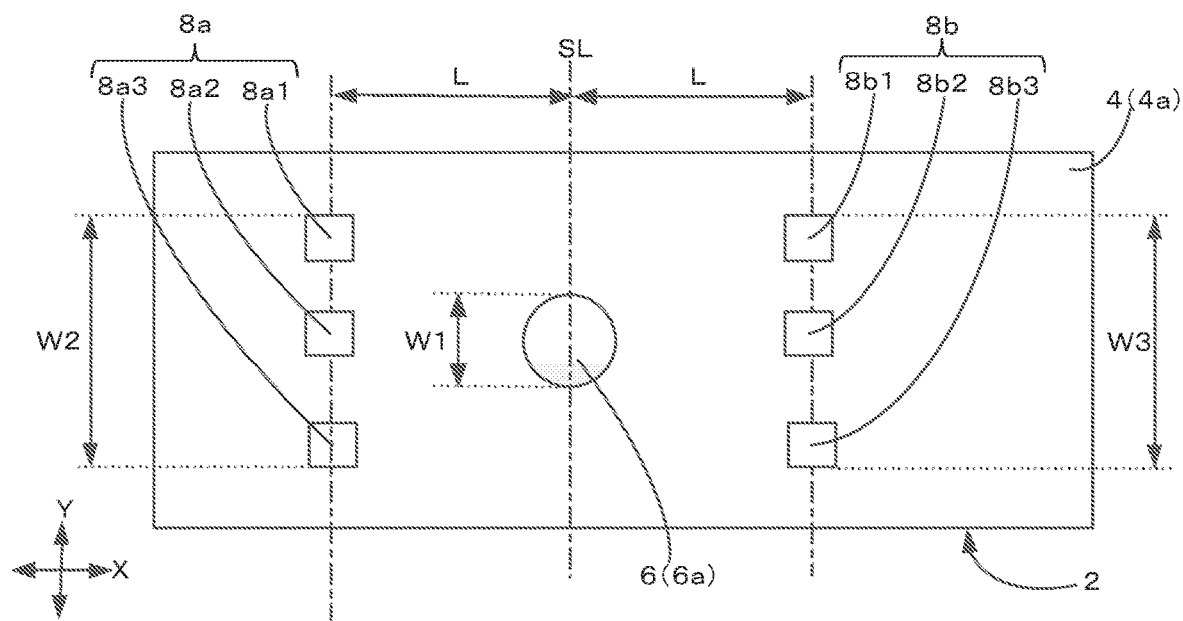
FIG. 6 is a plan view schematically showing a multilayer board according to a fourth preferred embodiment of the present invention.

FIG. 6 is a plan view schematically showing a multilayer board according to a fourth preferred embodiment of the present invention.

In the present preferred embodiment, the notches 8a and 8b defining the notch pair 8ab include a plurality of notch elements (8a1 to 8a3 and 8b1 to 8b3) juxtaposed in the Y-axis direction (second direction).

The notch 8a preferably includes, for example, three, square or substantially square, planar-shaped notch elements 8a1, 8a2, and 8a3 that are aligned in the Y-axis direction (second direction). Specifically, ends of the notch 8a in the Y-axis direction (second direction) correspond to outer ends of the outermost elements 8a1 and 8a3 of the plurality of notch elements 8a1 to 8a3. Accordingly, a length W2 of the notch 8a in the Y-axis direction (second direction) is designated as the distance between the outer ends of the outermost notch elements 8a1 and 8a3.

Similarly, the notch 8b preferably includes, for example, three, square or substantially square, planar-shaped notch elements 8b1, 8b2, and 8b3 that are aligned in the Y-axis direction (second direction). Specifically, ends of the notch 8b in the Y-axis direction (second direction) correspond to outer ends of the outermost elements 8b1 and 8b3 of the plurality of notch elements 8b1 to 8b3. Accordingly, a length W3 of the notch 8b in the Y-axis direction (second direction) is designated as the distance between the outer ends of the outermost notch elements 8b1 and 8b3.

Use of the notch elements enables the positions of the notches to be easily designed taking into account the strength calculation and enables the notches to be relatively easily machined. It is thus possible to structure the multilayer board 2 simultaneously to have both the flexibility and the mechanical strength. Furthermore, if the notch elements are have the same or substantially the same shape as that of the apertures of the via conductors, more effective designing and machining is feasible.

Although in FIG. 6 the notch preferably includes, for example, three notch elements, the notch may include any number of notch elements. Although in FIG. 6 the notch preferably has a square or substantially square, planar shape, the notch may have any other planar shape including a circle, for example.

Fifth Preferred Embodiment

Figure 7A:
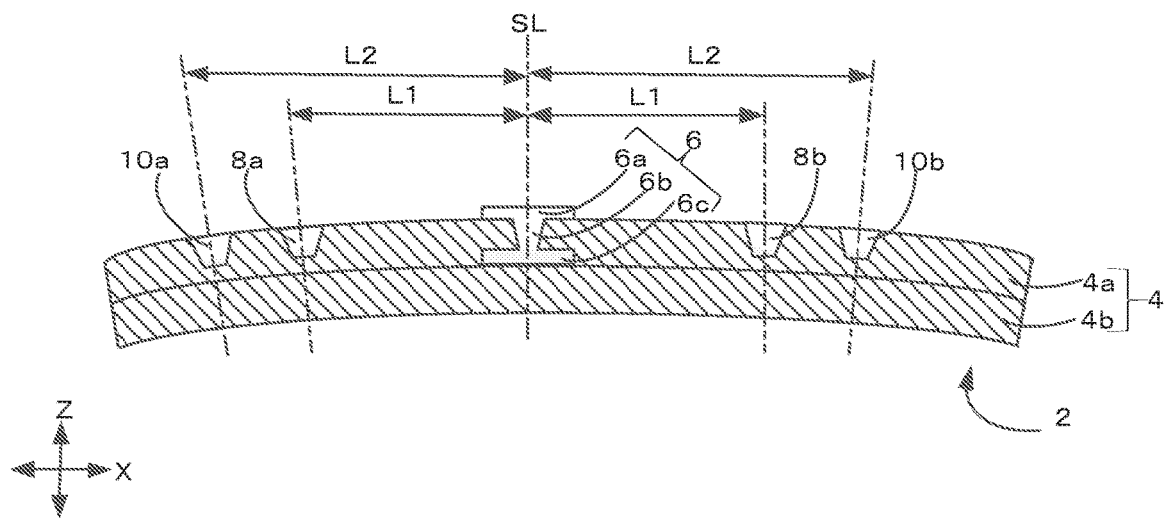
FIGS. 7A to 7B schematically show, in cross section, a multilayer board according to a fifth preferred embodiment of the present invention.
Figure 7B:
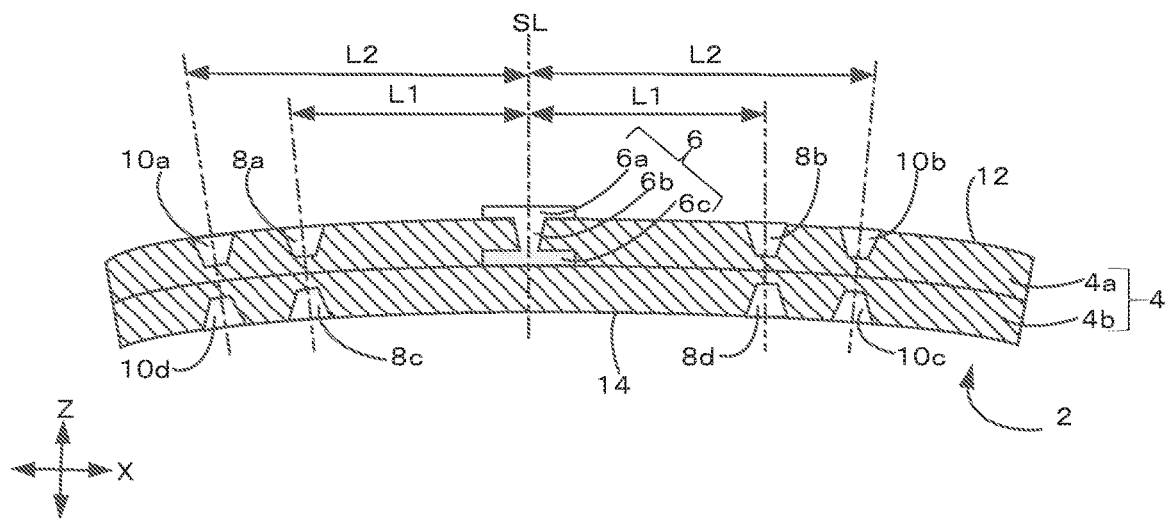

FIGS. 7A and 7B schematically show in cross section a multilayer board according to a fifth preferred embodiment of the present invention.

In the present preferred embodiment, a plurality of notch pairs 8*ab* and 10*ab* are preferably disposed at positions having different distances in the X-axis direction (first direction) from the position of the interlayer connection conductor 6. FIG. 7A shows the case in which the insulator layer 4*a* includes a plurality of notch pairs 8*ab* and 10*ab*, while FIG. 7B shows the case in which the insulator layers 4*a* and 4*b* includes a plurality of notch pairs 8*ab* and 10*ab* and notch pairs 8*cd* and 10*cd*, respectively.

To describe using FIG. 7A, the two notch pairs 8*ab* and 10*ab* are disposed at positions symmetrical or substantially symmetrical in the X-axis direction (first direction) with respect to the position of the interlayer connection conductor 6. To describe in more detail, the notches 8*a* and 8*b* are disposed symmetrically or substantially symmetrically at a distance L1 from a line SL of symmetry passing through the center of the via conductor 6*b*, while the notches 10*a* and 10*b* are disposed symmetrically or substantially symmetrically at a distance L2 from the line SL of symmetry.

The case of FIG. 7B is fundamentally similar to the case of FIG. 7A except that each of the insulator layers 4*a* and 4*b* includes two notch pairs. Note that another configuration may be provided in which the notches in the insulator layers 4*a* and 4*b* are respective disposed at different distances from the line SL of symmetry.

As described above, the present preferred embodiment is able to effectively disperse the bending stress concentrating in the interlayer connection conductor 6 and its peripheral region when a bending force is applied to the flexible base material 4, due to the disposition of the plurality of notch pairs 8*ab* and 10*ab* at positions having different distances in the X-axis direction (first direction) from the position of the interlayer connection conductor 6.

Sixth Preferred Embodiment

Figure 8A:
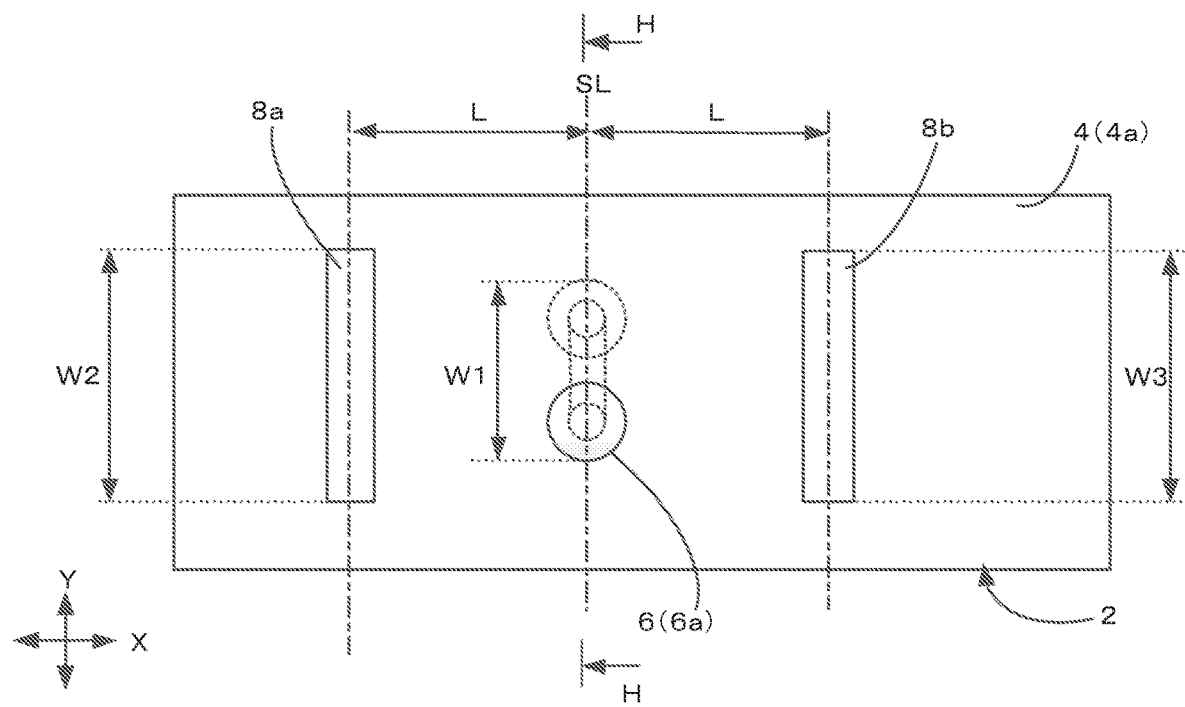
FIGS. 8A and 8B schematically show, in plan view and in cross section, a multilayer board according to a sixth preferred embodiment of the present invention.
Figure 8B:
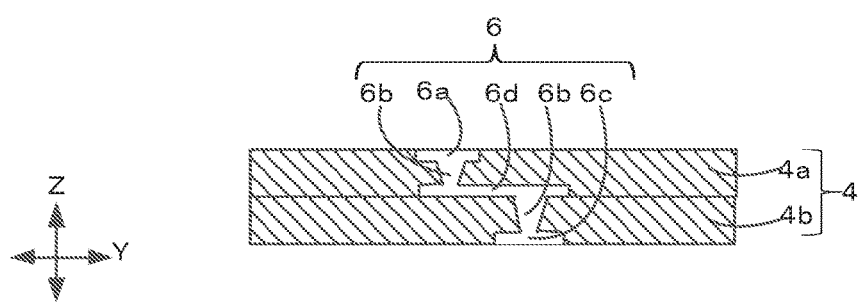

FIGS. 8A and 8B schematically show a multilayer board according to a sixth preferred embodiment of the present invention. FIG. 8A is a plan view and FIG. 8B is a cross sectional view taken along line H-H of FIG. 8A.

In the present preferred embodiment, the interlayer connection conductor 6 preferably includes interlayer connection conductor elements (i.e. via conductors) 6*b* staggered along the Y-axis direction (second direction) and a planar conductor element 6*d* joining the elements 6*b* together.

Even though any bending force is not directly applied in the Y-axis direction (second direction), if a bending force is applied in the X-axis direction (first direction), the flexible base material 4 may be subjected to a force twisting the flexible base material 4. In the case in which the flexible base material 4 is twisted, a bending force is applied not only in the X-axis direction (first direction) but also in the Y-axis direction (second direction).

In the present preferred embodiment, the structure of the interlayer connection conductor 6 enables the bending stress in the Y-axis direction (second direction) acting on the flexible base material 4 to be relieved.

Thus, due to having not only the function of relieving the bending stress in the X-axis direction (first direction) by the notch pair 8*ab* but also the function of relieving the bending stress in the Y-axis direction (second direction) by the interlayer connection conductor 6 itself, the relief of the bending stress acting on the interlayer connection conductor 6 and its peripheral region is able to be provided even in the case in which the flexible base material 4 becomes twisted.

Seventh Preferred Embodiment

Figure 9A:
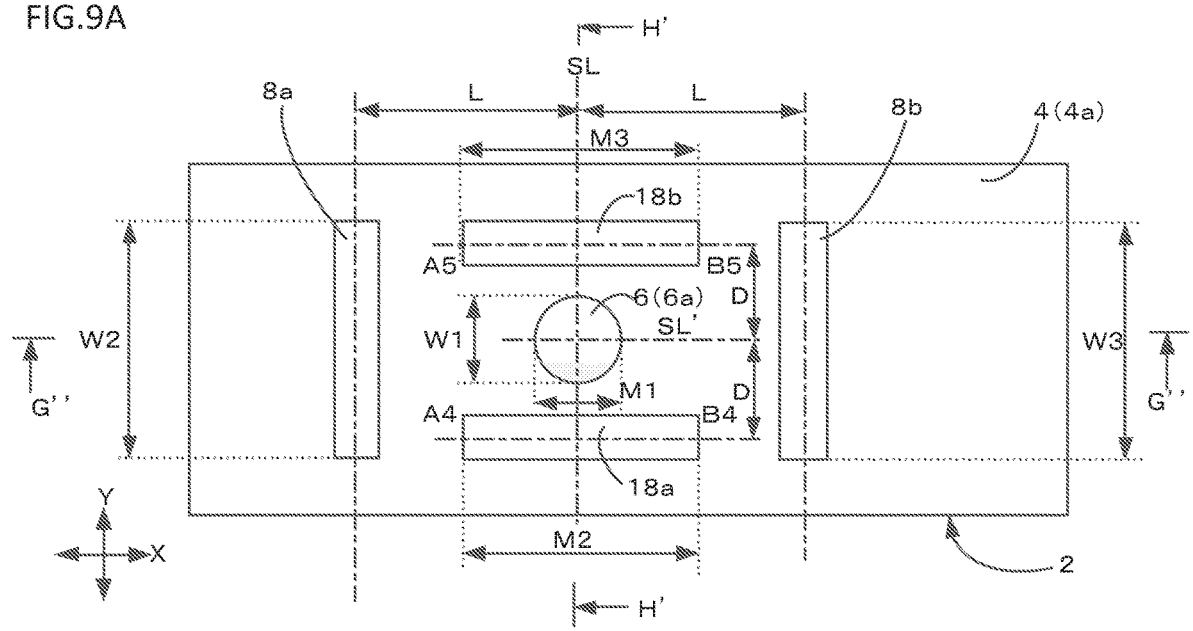
FIGS. 9A to 9C schematically show, in plan view and in cross section, a multilayer board according to a seventh preferred embodiment of the present invention.
Figure 9B:
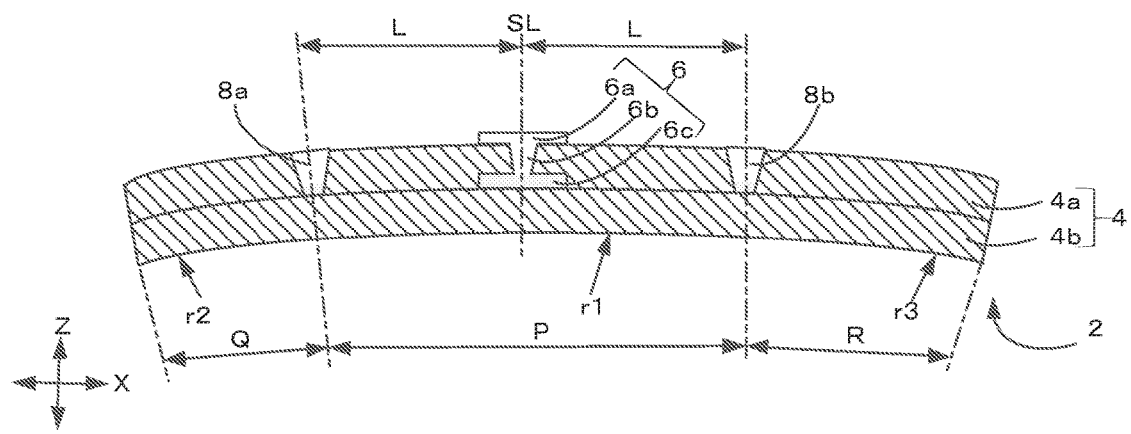
Figure 9C:
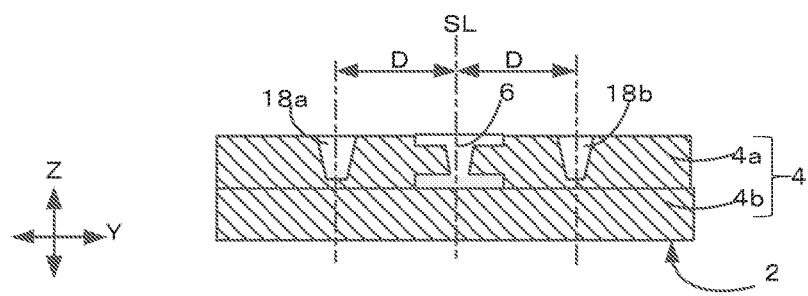

FIGS. 9A to 9C schematically show in plan view and in cross section a multilayer board according to a seventh preferred embodiment of the present invention. FIG. 9A is a plan view, FIG. 9B is a cross sectional view taken along line G"-G" of FIG. 9A, and FIG. 9C is a cross sectional view taken along line H'-H' of FIG. 9A.

In the present preferred embodiment, a notch pair 18*ab* extending in the X-axis direction (first direction) is further provided on the flexible base material 4 at positions symmetrical or substantially symmetrical in the Y-axis direction (second direction) thereof with respect to the position of the interlayer connection conductor 6. Specifically, the flexible base material 4 preferably includes the notch pair 18*ab* disposed at positions symmetrical or substantially symmetrical in the Y-axis direction (second direction) in addition to the notch pair 8*ab* disposed at positions symmetrical or substantially symmetrical in the X-axis direction (first direction).

The notch pair 8*ab* that is symmetrical or substantially symmetrical in the X-axis direction (first direction) shown in FIGS. 9A and 9B is similar to the above and will not repeatedly be described.

The following is a description of the notch 18*ab* that is symmetrical or substantially symmetrical in the Y-axis direction (second direction) shown in FIGS. 9A to 9C.

A length M1 of the interlayer connection conductor 6 in the X-axis direction (second direction) is smaller than a length M2 of the notch 18*a* and is smaller than a length M3 of the notch 18*b*. In plan view from the Z-axis direction (lamination direction), the interlayer connection conductor 6 is located within a region surrounded by the notches 18*a* and 18*b* defining the notch pair 18*ab* and lines respectively joining ends A4 and B4 of the notch 18*a* in the X-axis direction (first direction) and ends A5 and B5 of the notch 18*b* in the X-axis direction (first direction), respectively.

With this configuration, even in case a bending force is applied in the Y-axis direction (second direction), the bending stress in the Y-axis direction (second direction) acting on the flexible base material 4 is able to be relieved.

Thus, due to including not only the function of relieving the bending stress in the X-axis direction (first direction) by the notch pair 8*ab* but also the function of relieving the bending stress in the Y-axis direction (second direction) by the notch pair 18*ab*, the relief of the bending stress acting on the interlayer connection conductor 6 and its peripheral region is able to be provided even in the case in which the flexible base material 4 becomes twisted. Moreover, a sufficient bending stress relieving function is ensured not only in the case in which the flexible base material 4 is twisted but also in the case in which a bending force is applied in both the X-axis direction (first direction) and the Y-axis direction (second direction).

Although in FIG. 9C the flexible base material 4 is shown as not being curved along the Y-axis direction (second direction), some applications may use a flexible base material 4 that is curved not only along the X-axis direction (first direction) but also along the Y-axis direction (second direction).

Eighth Preferred Embodiment

Figure 10:
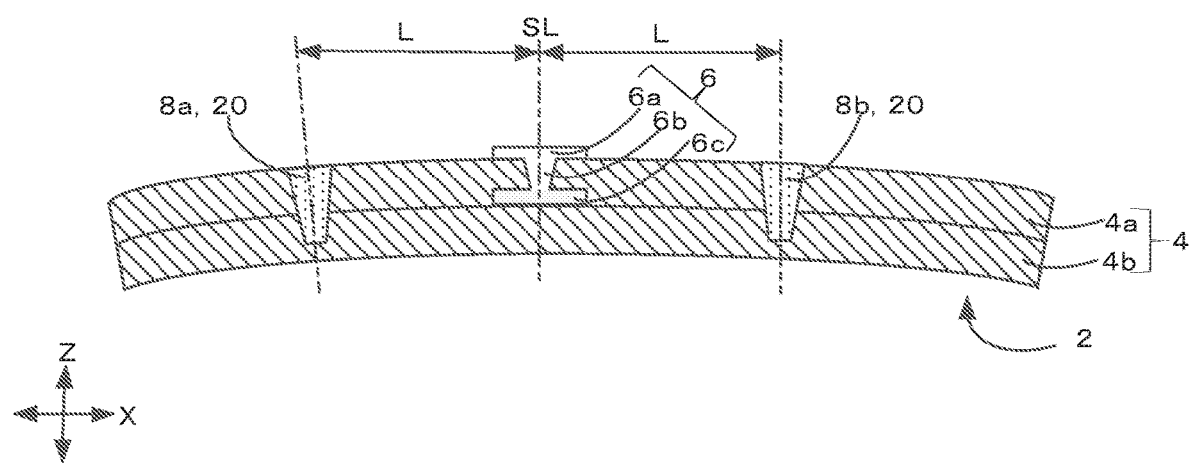
FIG. 10 is a cross sectional view schematically showing a multilayer board according to an eighth preferred embodiment of the present invention.

FIG. 10 is a cross sectional view schematically showing a multilayer board according to an eighth preferred embodiment of the present invention.

In the present preferred embodiment, a member 20 having a modulus of elasticity lower than moduli of elasticity of the insulator layers 4*a* and 4*b* is provided in the notches 8*a* and 8*b* defining the notch pair 8*ab*.

The member 20 may preferably be made of a silicon resin or an elastomer, for example, but any other material may be used depending on the modulus of elasticity of the insulator layers. For example, a predetermined resin material or rubber material may be filled into the notches 8a and 8b and hardened to form the member 20.

By providing the member 20 having a lower modulus of elasticity than the insulator layers 4a and 4b in the notches 8a and 8b as in the present preferred embodiment, damage of the notches 8a and 8b is able to be reduced or prevented when subjected to a stress.

It is to be appreciated that the above descriptions of the preferred embodiments of the present invention are merely examples in all respects and the present invention is not limited thereto. The preferred embodiments may appropriately be modified and changed by those skilled in the art. The scope of the present invention is defined by the claims, not by the above-described preferred embodiments of the present invention. Furthermore, the scope of the present invention encompasses changes from the preferred embodiments without departing from the claims and their equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
    a flexible base material including a plurality of laminated insulator layers and curved along a first direction on a plane orthogonal or substantially orthogonal to a lamination direction;
    an interlayer connection conductor disposed on the flexible base material; and
    a notch pair disposed on the flexible base material at positions symmetrical or substantially symmetrical in the first direction with respect to a position of the interlayer connection conductor, the notch pair extending in a second direction orthogonal or substantially orthogonal to the first direction on the plane; wherein
    in plan view from the lamination direction, the interlayer connection conductor is located within a region defined by notches defining the notch pair and by lines respectively joining respective ends of the notches in the second direction; and
    in the flexible base material, a radius of curvature of a region between the notch pair in the first direction is greater than radii of curvature of regions outside of the notch pair.

2. The multilayer board of claim 1, wherein a bottom in the lamination direction of each of the notches defining the notch pair does not coincide with a layer interface between the plurality of laminated insulator layers.

3. The multilayer board of claim 1, wherein the notch pair is disposed on a first main surface side and a second main surface side of the flexible base material.

4. The multilayer board of claim 1, wherein each of the notches defining the notch pair includes a plurality of notch elements aligned in the second direction.

5. The multilayer board of claim 1, wherein a plurality of the notch pairs are disposed at positions having different distances in the first direction from the position of the interlayer connection conductor.

6. The multilayer board of claim 1, wherein the interlayer connection conductor includes interlayer connection conductor elements staggered along the second direction and a planar conductor element joining the interlayer connection conductor elements together.

7. The multilayer board of claim 1, further comprising another notch pair extending in the first direction on the flexible base material at positions symmetrical or substantially symmetrical in the second direction with respect to the position of the interlayer connection conductor.

8. The multilayer board of claim 1, wherein a member having a modulus of elasticity lower than moduli of elasticity of the insulator layers is provided in each of the notches defining the notch pair.

9. The multilayer board of claim 1, wherein a length of each of the notches in the second direction is less than a length of the flexible base material in the second direction.

10. The multilayer board of claim 1, wherein the notches extend entirely through one of the plurality of laminated insulator layers.

11. The multilayer board of claim 1, wherein the interlayer connection conductor includes an upper electrode provided on an upper surface of one of the plurality of laminated insulator layers, a lower electrode provided on a lower surface of the one of the plurality of laminated insulator layers, and a via conductor extending through one of the plurality of laminated insulator layers to electrically join the upper and lower electrodes.

12. The multilayer board of claim 11, wherein the upper and lower electrodes have a circular or substantially circular planar shape.

13. The multilayer board of claim 1, wherein a length of the interlayer connection conductor in the second direction is less than a length of each of the notches in the second direction.

14. The multilayer board of claim 1, wherein the each of the notches extends only partially through an uppermost insulator layer of the plurality of laminated insulator layers.

15. The multilayer board of claim 1, wherein the each of the notches extends entirely through an uppermost insulator layer of the plurality of laminated insulator layers and partially through an insulator layer adjacent to the uppermost insulator layer.

* * * * *